(12) United States Patent
Uchida et al.

(10) Patent No.: US 9,379,250 B2
(45) Date of Patent: Jun. 28, 2016

(54) SEMICONDUCTOR DEVICE AND METHOD FOR PRODUCING SAME

(71) Applicant: Sharp Kabushiki Kaisha, Osaka-shi, Osaka (JP)

(72) Inventors: Seiichi Uchida, Osaka (JP); Yasuyuki Ogawa, Osaka (JP); Tadayoshi Miyamoto, Osaka (JP); Kazuatsu Ito, Osaka (JP); Yutaka Takamaru, Osaka (JP); Makoto Nakazawa, Osaka (JP); Mitsunobu Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/408,626

(22) PCT Filed: Jun. 12, 2013

(86) PCT No.: PCT/JP2013/066168
§ 371 (c)(1),
(2) Date: Dec. 17, 2014

(87) PCT Pub. No.: WO2013/191044
PCT Pub. Date: Dec. 27, 2013

(65) Prior Publication Data
US 2015/0200303 A1    Jul. 16, 2015

(30) Foreign Application Priority Data
Jun. 22, 2012    (JP) .................. 2012-140783

(51) Int. Cl.
*H01L 29/786* (2006.01)
*H01L 27/12* (2006.01)
(Continued)

(52) U.S. Cl.
CPC .......... *H01L 29/7869* (2013.01); *H01L 21/441* (2013.01); *H01L 27/1225* (2013.01);
(Continued)

(58) Field of Classification Search
CPC ......................... H01L 29/786; H01L 29/7869
See application file for complete search history.

(56) References Cited

U.S. PATENT DOCUMENTS

| 2011/0124153 A1* | 5/2011 | Hosoba | H01L 21/02554 438/104 |
| 2011/0204370 A1* | 8/2011 | Yoon | H01L 27/1214 257/59 |

(Continued)

FOREIGN PATENT DOCUMENTS

| JP | 2011-091279 A | 5/2011 |
| JP | 2012-018970 A | 1/2012 |

(Continued)

OTHER PUBLICATIONS

Official Communication issued in International Patent Application No. PCT/JP2013/066168, mailed on Jul. 9, 2013.

*Primary Examiner* — Jae Lee
(74) *Attorney, Agent, or Firm* — Keating & Bennett, LLP (57) ABSTRACT

This semiconductor device (100A) includes: a substrate (2); a gate electrode (3) formed on the substrate (2); a gate insulating layer (4) formed over the gate electrode (3); an oxide semiconductor layer (5) formed on the gate insulating layer (4); source and drain electrodes (6s, 6d) electrically connected to the oxide semiconductor layer (5); a first transparent electrode (7) electrically connected to the drain electrode (6d); an interlayer insulating layer (8a) including portions formed on the source and drain electrodes (6s, 6d); and a second transparent electrode (9) formed on the interlayer insulating layer (8a). At least a portion of the second transparent electrode (9) overlaps with the first transparent electrode (7) with the interlayer insulating layer (8a) interposed between them. And the oxide semiconductor layer (5) and the first transparent electrode (7) are formed out of a same oxide film.

5 Claims, 9 Drawing Sheets (51) Int. Cl.
*H01L 21/441* (2006.01)
*H01L 29/24* (2006.01)
*H01L 29/45* (2006.01)
*H01L 29/66* (2006.01)
*H01L 21/02* (2006.01)

(52) U.S. Cl.
CPC ............ *H01L27/1255* (2013.01); *H01L 29/24* (2013.01); *H01L 29/45* (2013.01); *H01L 29/66969* (2013.01); *H01L 29/78606* (2013.01); *H01L 21/02565* (2013.01)

(56) References Cited

U.S. PATENT DOCUMENTS

2012/0108018 A1   5/2012  Okabe et al.
2013/0119385 A1*  5/2013  Kao .................... H01L 27/1288
                                                          257/57

FOREIGN PATENT DOCUMENTS

WO    2011/010415 A1   1/2011
WO    2013/115052 A1   8/2013

* cited by examiner

SEMICONDUCTOR DEVICE AND METHOD FOR PRODUCING SAME

TECHNICAL FIELD

The present invention relates to a semiconductor device which is formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be hereinafter referred to as "TFTs"), each of which is provided for an associated one of pixels. An active-matrix substrate including TFTs as switching elements is called a "TFT substrate".

As for TFTs, a TFT which uses an amorphous silicon film as its active layer (and will be hereinafter referred to as an "amorphous silicon TFT") and a TFT which uses a polysilicon film as its active layer (and will be hereinafter referred to as a "polysilicon TFT") have been used extensively.

Recently, people have proposed that an oxide semiconductor be used as a material for the active layer of a TFT instead of amorphous silicon or polysilicon. Such a TFT will be hereinafter referred to as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor layer locally lowered.

CITATION LIST

Patent Literature

Patent Document No. 1: Japanese Laid-Open Patent Publication No. 2011-91279

SUMMARY OF INVENTION

Technical Problem

As the definition of liquid crystal display devices and other display devices has been further increased recently, it has become more and more necessary to integrate pixel TFTs contributing to a display operation and a driver circuit to drive those pixel TFTs on the same substrate together. In general, the pixel TFTs are arranged in a display area and the driver circuit is arranged in a driver circuit area which surrounds the display area.

However, the present inventors discovered via experiments that according to the manufacturing process disclosed in Patent Document No. 1, the area not contributing to a display operation (such as the planar area of the driver circuit area) would sometimes increase unnecessarily.

Thus, a primary object of an aspect of the present invention is to provide a TFT substrate which can be fabricated by a simple process and in which such an area not contributing to a display operation has been narrowed and a method for fabricating such a substrate.

Solution to Problem

A semiconductor device according to an embodiment of the present invention includes a substrate and a thin-film transistor formed on the substrate. The thin-film transistor includes: a gate electrode formed on the substrate; a gate insulating layer formed over the gate electrode; an oxide semiconductor layer formed on the gate insulating layer; and source and drain electrodes which are electrically connected to the oxide semiconductor layer. The semiconductor device further includes: a gate connecting layer formed out of a same conductive film as the gate electrode; a source connecting layer formed out of a same conductive film as the source electrode; a first transparent electrode which is electrically connected to the drain electrode; an interlayer insulating layer formed over the source and drain electrodes; a second transparent electrode formed on the interlayer insulating layer; and a transparent connecting layer formed out of a same conductive film as the second transparent electrode. The source connecting layer is electrically connected to the gate connecting layer via the transparent connecting layer, and the oxide semiconductor layer and the first transparent electrode are formed out of a same oxide film.

In one embodiment, the gate insulating layer is formed on the gate connecting layer. The source connecting layer contacts with an upper surface of an oxide layer formed out of the oxide film. The gate insulating layer and the interlayer insulating layer has a contact hole which overlaps with the gate connecting layer when viewed along a normal to the substrate. Portions of the source connecting layer and the oxide layer contact with each other inside the contact hole. And an electrical resistance of a portion of the oxide layer which contacts with the transparent connecting layer inside the contact hole is lower than an electrical resistance of the oxide semiconductor layer.

In one embodiment, an end portion of the source connecting layer is arranged over the gate connecting layer.

In one embodiment, the second transparent electrode overlaps with the first transparent electrode with the interlayer insulating layer interposed between them.

In one embodiment, the oxide film includes In, Ga and Zn.

In one embodiment, the first transparent electrode contains an impurity at a higher concentration than the oxide semiconductor layer, and a portion of the interlayer insulating layer which is located on the first transparent electrode contains an impurity at a higher concentration than the other portion thereof.

A method for fabricating a semiconductor device according to an embodiment of the present invention includes the steps of: (a) providing a substrate; (b) forming, on the substrate, a gate electrode and a gate connecting layer out of a first conductive film; (c) forming a gate insulating layer over the gate electrode and the gate connecting layer; (d) forming an oxide semiconductor film over the gate insulating layer; (e) forming a second conductive film on the oxide semiconductor film and patterning the oxide semiconductor film and the second conductive film, thereby forming first and second oxide semiconductor films separated from each other out of the oxide semiconductor film and forming source and drain electrodes and a source connecting layer out of the second conductive film, the source and drain electrodes being located on the first oxide semiconductor film, and the source connecting layer being located on the second oxide semiconductor film; (f) forming a protective layer to protect a channel region of the first oxide semiconductor film and then forming a first transparent electrode by performing a resistance lowering process to lower the resistance of a portion of the first oxide semiconductor film, an oxide semiconductor layer being formed in a rest of the first oxide semiconductor film, of which a resistance has not been lowered; (g) forming an interlayer insulating layer over the source and drain electrodes; and (h) forming, on the interlayer insulating layer, a second transparent electrode and a transparent connecting layer out of a transparent conductive film, the source connecting layer being electrically connected to the gate connecting layer via the transparent connecting layer.

In one embodiment, the step (g) includes the step (g1) of forming a contact hole which overlaps with the gate connecting layer when viewed along a normal to the substrate. At least a portion of the source connecting layer is located inside the contact hole. And the source connecting layer is electrically connected to the gate connecting layer via the transparent connecting layer inside the contact hole.

In one embodiment, the oxide semiconductor film includes In, Ga and Zn.

Advantageous Effects of Invention

Embodiments of the present invention provide a TFT substrate which can be fabricated by a simple process and in which an area not contributing to a display operation has been narrowed and a method for fabricating such a substrate.

BRIEF DESCRIPTION OF DRAWINGS

FIG. 1 (a) is a schematic plan view of a TFT substrate 100A according to an embodiment of the present invention. (b) is a schematic cross-sectional view of the TFT substrate 100A as viewed on the plane A-A' shown in (a).

FIG. 2 (a) is a schematic plan view illustrating a connecting portion to connect a gate connecting layer 3a and a source connecting layer 6a together. (b) is a schematic cross-sectional view thereof as viewed on the plane B-B' shown in FIG. 2(a). And (c) is a schematic plan view of the TFT substrate 100A.

FIG. 3 (a) to (c) are schematic plan views illustrating modified examples of a connecting portion to connect the gate connecting layer 3a and source connecting layer 6a together.

FIG. 4 (a) through (h) are schematic cross-sectional views illustrating respective manufacturing process steps to fabricate the TFT substrate 100A according to an embodiment of the present invention.

FIG. 5 (a) through (f) are schematic cross-sectional views illustrating respective manufacturing process steps to fabricate the TFT substrate 100A.

FIG. 6 (a) through (c) are schematic cross-sectional views illustrating respective manufacturing process steps to fabricate a modified example of the TFT substrate 100A according to another embodiment of the present invention.

FIG. 7 (a) through (c) are schematic cross-sectional views illustrating respective manufacturing process steps to fabricate a modified example of the TFT substrate 100A according to still another embodiment of the present invention.

FIG. 8 (a) through (c) are schematic cross-sectional views illustrating respective manufacturing process steps to fabricate a modified example of the TFT substrate 100A according to yet another embodiment of the present invention.

FIG. 9 (a) is a schematic plan view illustrating a connecting portion to connect the gate connecting layer 3a and source connecting layer 6a together according to a comparative example. (b) is a schematic cross-sectional view as viewed on the plane B-B' shown in FIG. 9(a).

FIG. 10 (a) is a schematic plan view illustrating a connecting portion to connect the gate connecting layer 3a and source connecting layer 6a together according to another comparative example. (b) is a schematic cross-sectional view as viewed on the plane B-B' shown in FIG. 10(a).

DESCRIPTION OF EMBODIMENTS

A semiconductor device as an embodiment of the present invention will now be described with reference to the accompanying drawings. The semiconductor device of this embodiment includes a thin-film transistor with an active layer made of an oxide semiconductor (which will be hereinafter referred to as an "oxide semiconductor TFT"). It should be noted that the semiconductor device of this embodiment just needs to include an oxide semiconductor TFT and is broadly applicable to an active-matrix substrate and various kinds of display devices and electronic devices.

In the following description, a semiconductor device as an embodiment of the present invention will be described as being applied to an oxide semiconductor TFT for use in a liquid crystal display device. It should be noted that the semiconductor device to be described below shares some common features with the semiconductor device disclosed in PCT International Application No. PCT/JP2013/051422, the entire disclosure of which is hereby incorporated by reference.

Figure 1:
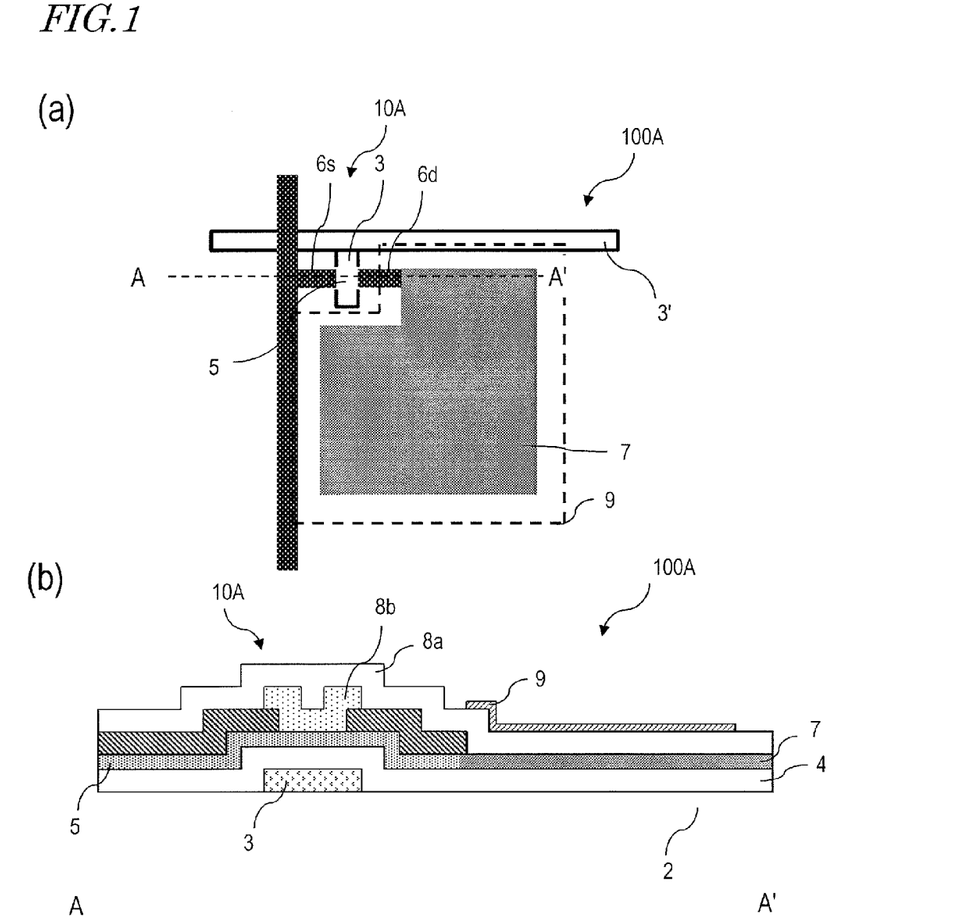
Figure 2:
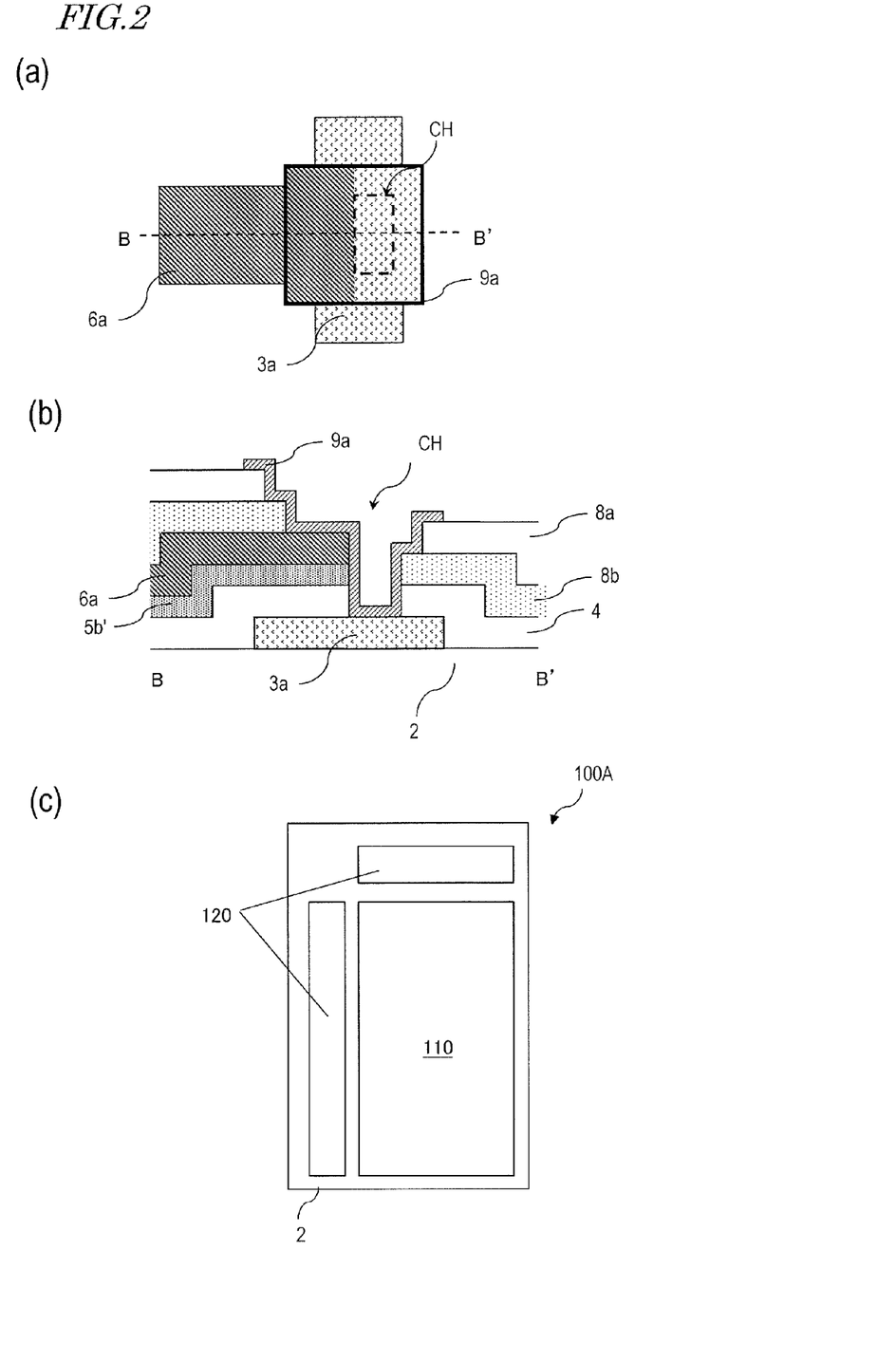

FIGS. 1(a) and 2(c) are schematic plan views of a TFT substrate 100A according to this embodiment. FIG. 1(b) is a schematic cross-sectional view of the semiconductor device (TFT substrate) 100A as viewed on the plane shown in FIG. 1(a). FIG. 2(a) is a schematic plan view illustrating a structure for connecting a gate connecting layer 3a and a source connecting layer 6a together on the TFT substrate 100A. And FIG. 2(b) is a schematic cross-sectional view thereof as viewed on the plane B-B' shown in FIG. 2(a).

As shown in FIGS. 1(a) and 1(b), the TFT substrate 100A includes a substrate 2 and a thin-film transistor (TFT) 10A formed on the substrate 2. The TFT 10A includes: a gate electrode 3 formed on the substrate 2; a gate insulating layer 4 formed over the gate electrode 3; an oxide semiconductor layer 5 formed on the gate insulating layer 4; and source and drain electrodes 6s, 6d which are electrically connected to the oxide semiconductor layer 5. The TFT substrate 100A further includes: a gate connecting layer 3a formed out of the same conductive film as the gate electrode 3; a source connecting layer 6a formed out of the same conductive film as the source electrode 6s; a transparent electrode 7 electrically connected to the drain electrode 6d; an interlayer insulating layer 8a formed over the source and drain electrodes 6s, 6d; a transparent electrode 9 formed on the interlayer insulating layer 8a; and a transparent connecting layer 9a formed out of the same conductive film as the transparent electrode 9. The source connecting layer 6a is electrically connected to the gate connecting layer 3a via the transparent connecting layer 9a, and the oxide semiconductor layer 5 and the transparent electrode 7 have been formed out of the same oxide film, which may include In, Ga and Zn.

Also, as shown in FIGS. 2(a) and 2(b), in the TFT substrate 100A, the gate insulating layer 4 has been formed on the gate connecting layer 3a, the source connecting layer 6a contacts with the upper surface of an oxide layer 5b' formed out of the oxide film (and which will be sometimes hereinafter referred to as an "oxide semiconductor film 5b'), and a contact hole CH which overlaps with the gate connecting layer 3a when viewed along a normal to the substrate 2 has suitably been cut through the gate insulating layer 4 and the interlayer insulating layer 8a. Furthermore, portions of the source connecting layer 6 and oxide layer 5b' suitably contact with each other inside the contact hole CH, and the electrical resistance of a portion of the oxide layer 5b' which contacts with the transparent connecting layer 9a inside the contact hole CH is suitably lower than that of the oxide semiconductor layer 5.

As shown in FIG. 2(c), the TFT substrate 100A includes a display area 110 and a driver circuit area 120 surrounding the display area 110. The TFTs 10A have been formed in the display area 110. On the other hand, the gate connecting layer 3a, source connecting layer 6a and transparent connecting layer 9a have been formed in the driver circuit area 120. The driver circuit area 120 does not contribute to a display operation, and therefore, suitably has as small a planar area as possible.

In this TFT substrate 100A, the planar area of the driver circuit area 120 that does not contribute to a display operation can be decreased, and therefore, that of the display area 110 that contributes to a display operation can be increased accordingly.

The reason will be described with reference to FIGS. 9 and 10. FIGS. 9(a) and 10(a) are schematic plan views illustrating a connecting portion to connect a gate connecting layer 3a and a source connecting layer 6a together according to comparative examples. FIGS. 9(b) and 10(b) are cross-sectional views as viewed on the planes B-B' shown in FIGS. 9(a) and 10(a), respectively. Any component also included in the TFT substrate 100A and having substantially the same function as its counterpart is identified by the same reference numeral as its counterpart's and description thereof will be omitted herein to avoid redundancies.

In the comparative example illustrated in FIGS. 9(a) and 9(b), the gate connecting layer 3a and source connecting layer 6a do not have any portions overlapping with each other when viewed along a normal to the substrate 2, unlike the TFT substrate 100A. That is why when the gate connecting layer 3a and source connecting layer 6a need to be electrically connected together, contact holes CH1 and CH2 are cut to expose respective portions of these connecting layers 3a and 6a and then a transparent connecting layer 9a is formed, thereby electrically connecting the gate connecting layer 3a and source connecting layer 6a together. According to this example, two contact holes CH1 and CH2 need to be cut, thus increasing the planar area of the driver circuit area 120 that does not contribute to a display operation accordingly.

On the other hand, in the TFT substrate 100A shown in FIGS. 2(a) and 2(b), the gate connecting layer 3a and source connecting layer 6a can be electrically connected together through a single contact hole CH. That is to say, since there is no need to create a lot of contact holes, the increase in the planar area of the driver circuit area 120 can be avoided.

Furthermore, in the comparative example shown in FIGS. 10(a) and 10(b), a hole 4u is cut through a portion of the gate insulating layer 4 to expose the gate connecting layer 3a partially and then the gate connecting layer 3a and source connecting layer 6a are electrically connected together inside the hole 4u. According to this example, only one hole 4u needs to be created, and therefore, an increase in the planar area of the driver circuit area 120 can be certainly avoided. However, since an additional photomask is needed to cut the hole 4u, the manufacturing process gets complicated and the manufacturing cost increases after all.

Figure 9:
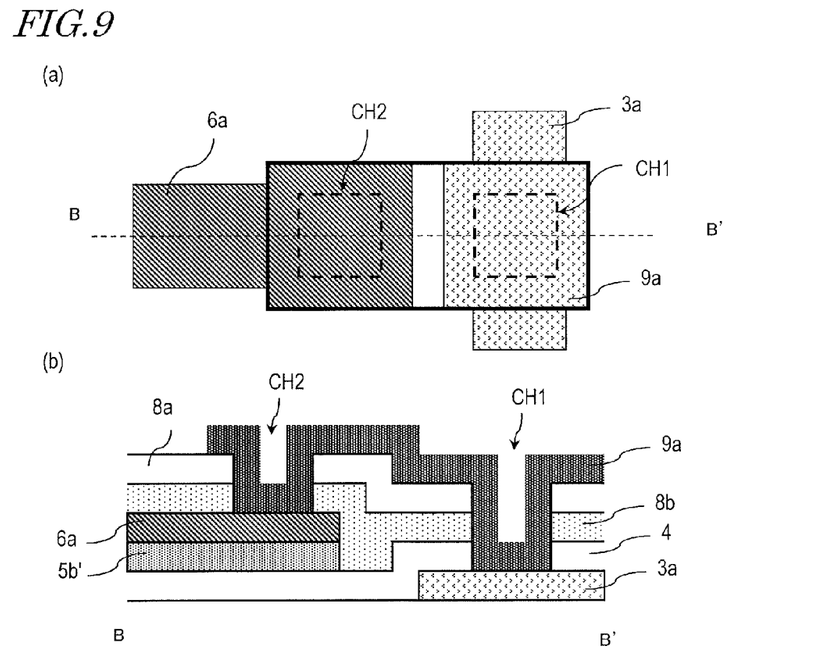
Figure 10:
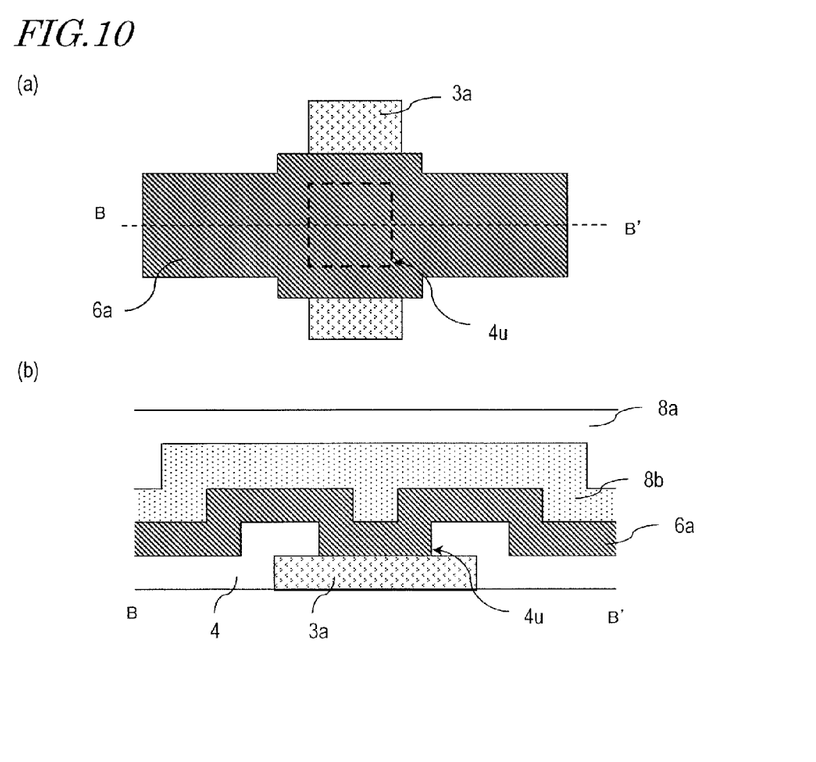

As can be seen from the foregoing description, the TFT substrate 100A can be fabricated by a simpler method with the area that does not contribute to a display operation narrowed and without increasing the manufacturing cost, than in the comparative examples shown in FIGS. 9 and 10.

Figure 3:
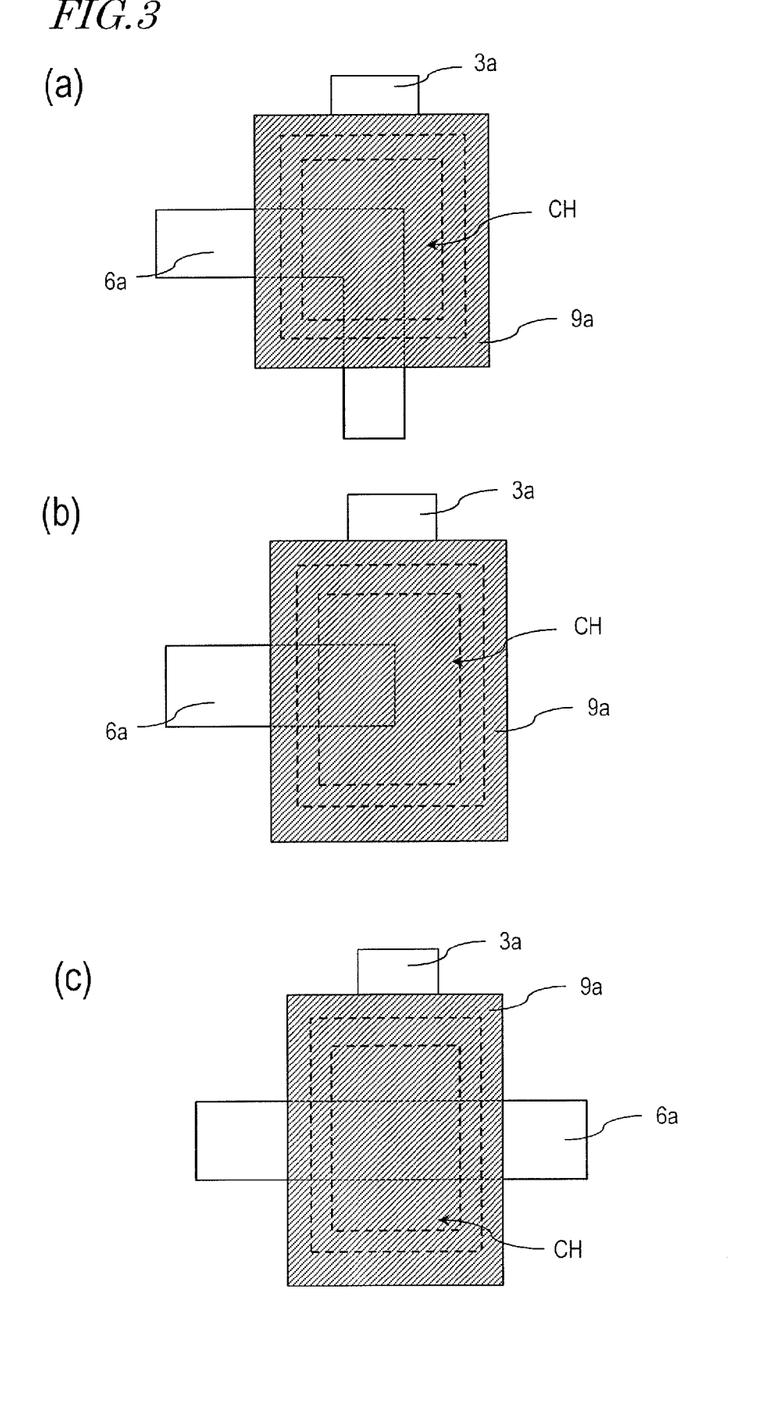

Also, as shown in FIGS. 3(a) to 3(c), the gate connecting layer 3a and source connecting layer 6a may be connected together in various other ways. FIGS. 3(a) to 3(c) are schematic plan views each illustrating a connecting portion to connect the gate connecting layer 3a and source connecting layer 6a together.

For example, the source connecting layer 6a may have an L-shaped portion which is arranged over the gate connecting layer 3a as shown in FIG. 3(a). Alternatively, an end portion of the source connecting layer 6a may be arranged over the gate connecting layer 3a as shown in FIG. 3(b). Still alternatively, the source connecting layer 6a may be arranged so as to run as a line over the gate connecting layer 3a as shown in FIG. 3(c). In each of the examples illustrated in FIGS. 3(a) to 3(c), a transparent connecting layer 9a is arranged where the gate connecting layer 3a and source connecting layer 6a overlap with each other, and the gate connecting layer 3a is electrically connected to the source connecting layer 6a via the transparent connecting layer 9a.

In this TFT substrate 100A, at least a part of the transparent electrode 9 overlaps with the transparent electrode 7 with the interlayer insulating layer 8a interposed between them, thus forming a storage capacitor there as shown in FIG. 1(b). However, the storage capacitor that this TFT substrate 100A has is transparent (i.e., can transmit visible light), and does not decrease the aperture ratio. Consequently, this TFT substrate 100A can have a higher aperture ratio than a conventional TFT substrate with a storage capacitor including a non-transparent electrode formed out of a metal film (i.e., a gate metal layer or source metal layer). On top of that, since the aperture ratio is not decreased by the storage capacitor, the capacitance value of the storage capacitor (i.e., the area of the storage capacitor) can be increased as needed, which is also advantageous.

Furthermore, a drain electrode 6d has been formed on the transparent electrode 7 and the transparent electrode 7 is suitably in direct contact with the drain electrode 6d. If such a structure is adopted, the transparent electrode 7 can be formed to almost reach an end portion of the drain electrode 6d, and therefore, this TFT substrate 100A can have a higher aperture ratio than the TFT substrate disclosed in Patent Document No. 1.

In this TFT substrate 100A, a protective layer 8b has been formed over the interlayer insulating layer 8a, source electrode 6s, drain electrode 6d and source connecting layer 6a. The protective layer 8b is in contact with the channel region of the oxide semiconductor layer 5. In some cases, the protective layer 8b is omitted.

Next, respective components of the TFT substrate 100A will be described in detail one by one.

The substrate 2 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 2 may also be a silicon substrate.

The gate electrode 3 is electrically connected to a gate line 3'. The gate electrode 3, gate connecting layer 3a and gate line 3' may have a multilayer structure, of which the upper layer is a W (tungsten) layer and the lower layer is a TaN (tantalum nitride) layer, for example. Alternatively, the gate electrode 3, gate connecting layer 3a and gate line 3' may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3, gate connecting layer 3a and gate line 3' may be made of an element selected from the group consisting of Cu (copper), Al, Cr (chromium), Ta (tantalum), Ti (titanium), Mo and W or an alloy or metal nitride which is comprised mostly of any of these elements. The thickness of the gate electrode 3, gate connecting layer 3a and gate line 3' suitably falls within the range of about 50 nm to about 600 nm, for example. The gate electrode 3, gate connecting layer 3a and gate line 3' may each have a thickness of approximately 420 nm, for example.

The gate insulating layer 4 is comprised of lower and upper gate insulating layers. The upper gate insulating layer suitably includes an oxide insulating layer, which is suitably in direct contact with the oxide semiconductor layer 5. If the oxide insulating layer is in direct contact with the oxide semiconductor layer 5, oxygen included in the oxide insulating layer is supplied to the oxide semiconductor layer 5, and it is possible to prevent the oxygen deficiencies in the oxide semiconductor layer 5 from deteriorating the semiconductor properties. The upper gate insulating layer may be an $SiO_2$ (silicon dioxide) layer, for example, while the lower gate insulating layer may be an $SiN_x$ (silicon nitride) layer, for example. In this embodiment, the lower gate insulating layer may have a thickness of approximately 325 nm, the upper gate insulating layer may have a thickness of approximately 50 nm, and the gate insulating layer 4 may have an overall thickness of approximately 375 nm. The gate insulating layer 4 may be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 4 suitably falls within the range of about 50 nm to about 600 nm. To prevent dopants from diffusing from the substrate 2, the lower gate insulating layer is suitably made of $SiN_x$ or $SiN_xO_y$ (silicon nitride oxide, where x>y). Meanwhile, to prevent the semiconductor properties of the oxide semiconductor layer 5 from deteriorating, the upper gate insulating layer is suitably made of $SiO_2$ or $SiO_xN_y$ (silicon oxynitride, where x>y). Furthermore, to form a dense gate insulating layer 4 which causes little gate leakage current at low temperatures, the gate insulating layer 4 is suitably formed using a rare gas of Ar (argon), for example.

The oxide semiconductor layer 5 may be an In—Ga—Zn—O based semiconductor layer including In (indium), Ga (gallium) and Zn (zinc) at the ratio of 1:1:1, for example (which will be hereinafter referred to as "In—Ga—Zn—O based semiconductor layer"). The ratio of In, Ga and Zn may be selected appropriately. However, the oxide semiconductor layer 5 does not have to be formed out of an In—Ga—Zn—O based semiconductor film, but may also be formed out of any other suitable oxide semiconductor film such as a Zn—O based semiconductor (ZnO) film, an In—Zn—O based semiconductor (IZOT™) film, a Zn—Ti—O based semiconductor (ZTO) film, a Cd—Ge—O based semiconductor film, a Cd—Pb—O based semiconductor film, a CdO (cadmium oxide) film, or an Mg—Zn—O based semiconductor film. Furthermore, the oxide semiconductor layer 5 may also be made of ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all. The thickness of the oxide semiconductor layer 5 suitably falls within the range of about 30 nm to about 100 nm, for example. The oxide semiconductor layer 5 may have a thickness of about 50 nm, for example.

The source electrode 6s, drain electrode 6d, and source connecting layer 6a may have a multilayer structure consisting of Ti, Al and Ti layers, for example. Alternatively, the source electrode 6s, drain electrode 6d, and source connecting layer 6a may also have a multilayer structure consisting of Mo, Al and Mo layers or may even have a single-layer structure, a double layer structure, or a multilayer structure consisting of four or more layers. Still alternatively, the source electrode 6s, drain electrode 6d, and source connecting layer 6a may be made of an element selected from the group consisting of Al, Cr, Ta, Ti, Mo and W or an alloy or metal nitride which is comprised mostly of any of these elements. The thickness of the source electrode 6s, drain electrode 6d, and source connecting layer 6a suitably falls within the range of about 50 nm to about 600 nm, for example. In this embodiment, the source electrode 6s, drain electrode 6d, and source connecting layer 6a may have a thickness of approximately 350 nm, for example.

The interlayer insulating layer 8a may be made of $SiN_x$, for example. The interlayer insulating layer 8a is arranged between the transparent electrodes 7 and 9 to form a storage capacitor there. If a storage capacitor is formed of those transparent electrodes 7 and 9 and the transparent interlayer insulating layer 8a in this manner, a display panel with a high aperture ratio can be fabricated when this TFT substrate 100A is used to make a display panel. The thickness of the interlayer insulating layer 8a suitably falls within the range of about 100 nm to about 500 nm. In this embodiment, the interlayer insulating layer 8a may have a thickness of approximately 200 nm. Alternatively, the interlayer insulating layer 8a may also be made of $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$), for example.

The protective layer 8b has been formed so as to contact with the channel region of the oxide semiconductor layer 5. The protective layer 8b is suitably made of an insulating oxide (such as $SiO_2$). If the protective layer 8b is made of an insulating oxide, it is possible to prevent the oxygen deficiencies in the oxide semiconductor layer 5 from deteriorating the semiconductor properties as described above. Alternatively, the protective layer 8b may also be made of SiON (which may be either silicon oxynitride or silicon nitride oxide), $Al_2O_3$ or $Ta_2O_5$, for example. The thickness of the protective layer 8b suitably falls within the range of about 50 nm to about 300 nm, for example. In this embodiment, the protective layer 8b may have a thickness of about 150 nm, for example.

The transparent electrode 7 may be formed out of an In—Ga—Zn—O based oxide, for example. As will be described in detail later, the transparent electrode 7 and oxide semiconductor layer 5 are formed out of the same transparent oxide film (such as an In—Ga—Zn—O based oxide film). If the transparent electrode 7 and oxide semiconductor layer 5 are formed out of the same oxide film, the manufacturing process can be simplified and the manufacturing cost can be cut down. The transparent electrode 7 suitably has a thickness of about 20 nm to about 200 nm. In this embodiment, the transparent electrode 7 may have a thickness of about 50 nm, for example.

As will be described in detail later, the transparent electrode 7 may contain either a p-type impurity (such as B (boron)) or an n-type impurity (such as P (phosphorus)) at a higher concentration than the oxide semiconductor layer 5 A portion of the interlayer insulating layer 8a which is located on the transparent electrode 7 may contain either a p-type impurity or an n-type impurity at a higher concentration than anywhere else.

The transparent electrode 9 is formed out of a transparent conductive film (of ITO (indium tin oxide) or IZO, for example). The thickness of the transparent electrode 9 suitably falls within the range of about 20 nm to about 200 nm, for example. In this embodiment, the transparent electrode 9 may have a thickness of about 100 nm, for example.

This TFT substrate 100A may be used in a fringe field switching (FFS) mode liquid crystal display device, for example. In this case, the transparent electrode 7 that forms the lower layer is used as a pixel electrode (to which a display signal voltage is applied) and the transparent electrode 9 that forms the upper layer is used as a common electrode (to which either a common voltage or a counter voltage is applied). At least one slit is cut through the transparent electrode 9.

Next, an exemplary method for fabricating the TFT substrate 100A will be described.

A method for fabricating a TFT substrate 100A according to an embodiment of the present invention includes the steps of: (a) providing a substrate 2; (b) forming, on the substrate 2, a gate electrode 3 and a gate connecting layer 3a out of a first conductive film; (c) forming a gate insulating layer 4 over the gate electrode 3 and the gate connecting layer 3a; and (d) forming an oxide semiconductor film 5' over the gate insulating layer 4. The method for fabricating the TFT substrate 100A further includes the step (e) of forming a second conductive film on the oxide semiconductor film 5' and patterning the oxide semiconductor film 5' and the second conductive film, thereby splitting the oxide semiconductor film 5' into first and second oxide semiconductor films and forming source and drain electrodes 6s, 6d and a source connecting layer 6a out of the second conductive film so that the source and drain electrodes 6s, 6d are located on the first oxide semiconductor film 5a' and the source connecting layer 6a is located on the second oxide semiconductor film 5b'. The method for fabricating the TFT substrate 100A further includes the steps of (f) forming a protective layer 8 to protect a channel region of the first oxide semiconductor film 5a' and then performing a resistance lowering process to lower the resistance of a portion of the first oxide semiconductor film 5a', thereby forming a transparent electrode 7 and turning the rest of the first oxide semiconductor film 5a' that has not had its resistance lowered into an oxide semiconductor layer 5; (g) forming an interlayer insulating layer 8a over the source and drain electrodes 6s, 6d; and (h) forming, on the interlayer insulating layer 8a, a transparent electrode 9 and a transparent connecting layer 9a out of a transparent conductive film, thereby electrically connecting the source connecting layer 6a to the gate connecting layer 3a via the transparent connecting layer 9a.

The step (g) suitably includes the step (g1) of cutting a contact hole CH which overlaps with the gate connecting layer 3a when viewed along a normal to the substrate 2. At least a portion of the source connecting layer 6a is suitably located inside the contact hole CH. And the source connecting layer 6a is suitably electrically connected to the gate connecting layer 3a via the transparent connecting layer 9a inside the contact hole CH.

Such a method for fabricating a TFT substrate 100A is a simplified method for fabricating a semiconductor device and will contribute to cutting the manufacturing cost. In addition, the planar area of the driver circuit area 120 can also be reduced.

Next, an exemplary method for fabricating the TFT substrate 100A will be described in detail with reference to FIGS. 4 and 5. Portions (a) through (d) of FIG. 4 and portions (a) to (c) of FIG. 5 are schematic cross-sectional views illustrating respective manufacturing process steps to fabricate a TFT 10A in the display area 110 of the TFT substrate 100A. On the other hand, portions (e) through (h) of FIG. 4 and portions (d) to (f) of FIG. 5 are schematic cross-sectional views illustrating respective manufacturing process steps to fabricate a driver circuit TFT, a gate connecting layer 3a and a source connecting layer 6a in the driver circuit area 120 of the TFT substrate 100A.

Figure 4:
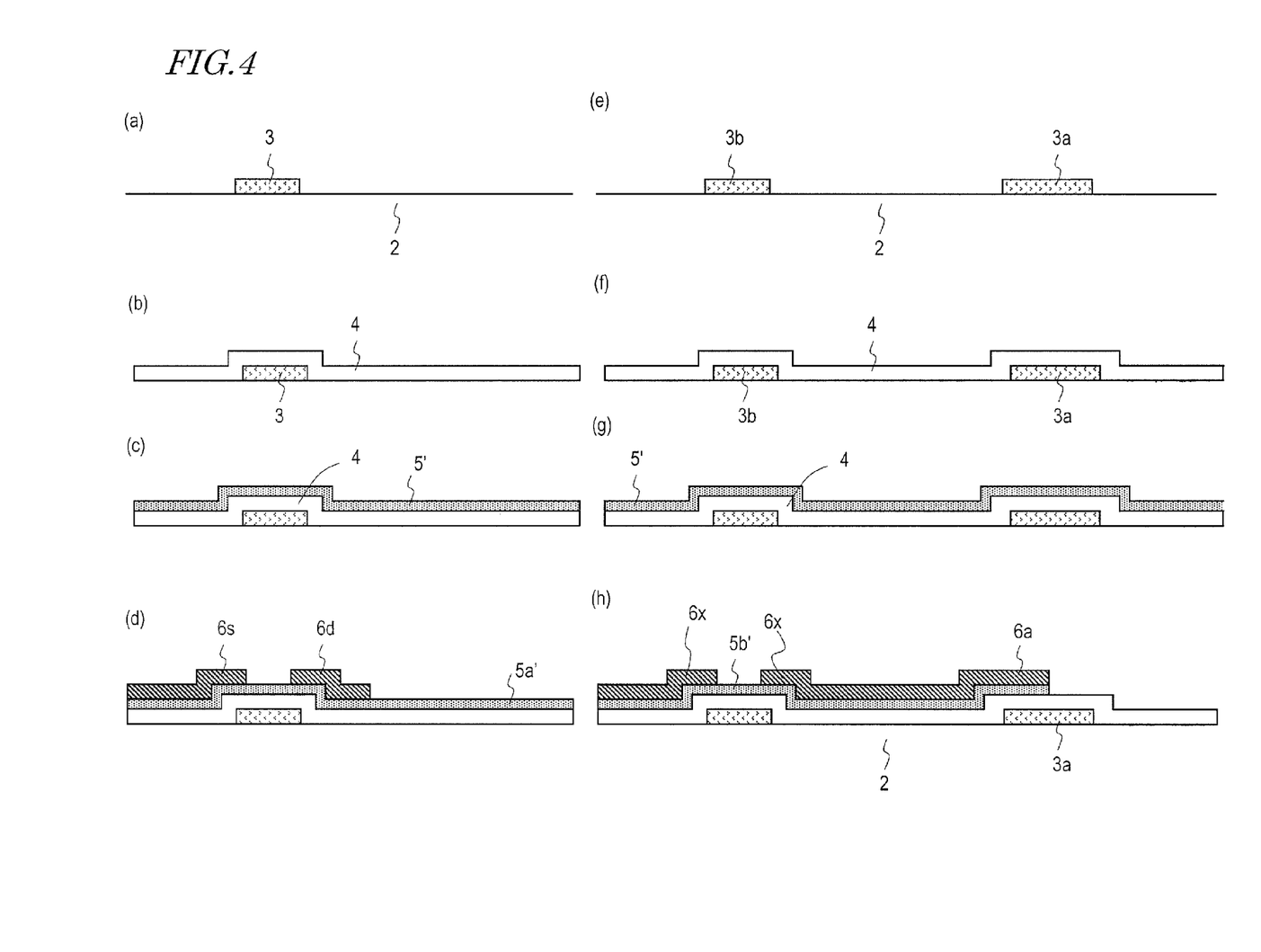
Figure 5:
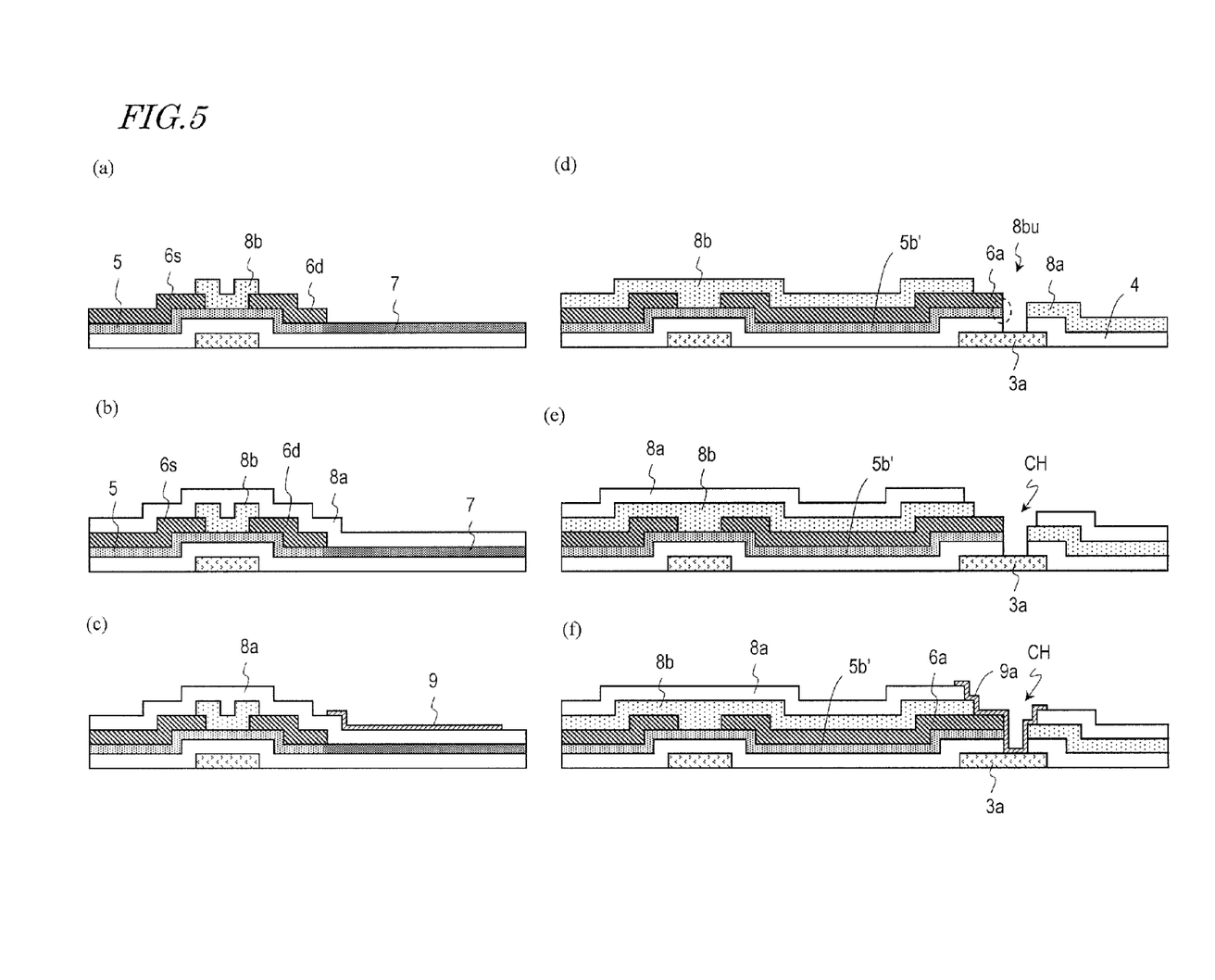

First of all, as shown in portions (a) and (e) of FIG. 4, gate electrodes 3a, 3b and a gate connecting layer 3a are formed on the substrate 2 out of the same conductive film. As the substrate 2, a transparent insulating substrate such as a glass substrate may be used, for example. The gate electrodes 3a, 3b and gate connecting layer 3b may be formed by depositing a conductive film on the substrate 2 by sputtering process and then patterning the conductive film by photolithographic process. In this embodiment, used as the conductive film is a multilayer structure with a double-layer structure, in which a TaN film (with a thickness of about 50 nm) and a W film (with a thickness of about 370 nm) have been stacked in this order on the substrate 2. Alternatively, a single-layer film, a multi-layer film, an alloy film or a metal nitride film including an element selected from the group consisting of Ti, Mo, Ta, W, Cu, Al and Cr may also be used as the conductive film.

Next, as shown in portions (b) to (f) of FIG. 4, a gate insulating layer 4 is formed by CVD (chemical vapor deposition) process over the gate electrodes 3, 3b and gate connecting layer 3b. In this embodiment, the gate insulating layer 4 is comprised of a lower gate insulating layer and an upper gate insulating layer. The lower gate insulating layer is formed out of an $SiN_x$ film (with a thickness of about 325 nm) and the upper gate insulating layer is formed out of an $SiO_2$ film (with a thickness of about 50 nm). These upper and lower gate insulating layers may be made of $SiO_2$, $SiN_x$, $SiO_xN_y$ (silicon oxynitride, where x>y), $SiN_xO_y$ (silicon nitride oxide, where x>y), $Al_2O_3$, or $Ta_2O_5$, for example.

Subsequently, as shown in portions (c) and (g) of FIG. 4, an oxide semiconductor film 5' is formed over the gate insulating layer 4 by sputtering process. As the oxide semiconductor film 5', an In—Ga—Zn—O based semiconductor film may be used. The oxide semiconductor film 5' may have a thickness of about 50 nm, for example.

Thereafter, a conductive film (not shown) to be source and drain electrodes 6s, 6d, source and drain electrodes 6x and a source connecting layer 6a is formed by sputtering process over the oxide semiconductor film 5'.

Thereafter, as shown in portions (d) to (h) of FIG. 4, the conductive film and the oxide semiconductor film 5' are patterned simultaneously by photolithographic process using a half-tone mask, dry etching process and ashing process, thereby splitting the oxide semiconductor film 5' into first and second oxide semiconductor films 5a' and 5b' and forming a source electrode 6s, a drain electrode 6d, source/drain electrodes 6x and a source connecting layer 6a out of the conductive film. Since the source and drain electrodes 6s, 6d can be formed and the oxide semiconductor film 5' can be patterned into an intended shape in this manner using a single photomask, the manufacturing process can be simplified and the manufacturing cost can be cut down.

The source and drain electrodes 6s, 6d are formed on the first oxide semiconductor film 5a'. The source/drain electrodes x and source connecting layer 6a are formed on the second oxide semiconductor film 5b'. One of the source/drain electrodes 6x is electrically connected to the source connecting layer 6a. At least a portion of the source connecting layer 6a is formed so as to overlap with the gate connecting layer 3a when viewed along a normal to the substrate 2. The source/drain electrodes 6x are formed so as to contact with the upper surface of the second oxide semiconductor film 5b'.

The source electrode 6s, drain electrode 6d, source/drain electrodes 6x and source connecting layer 6a may have a multilayer structure consisting of Ti, Al and Ti layers, for example. The lower Ti layer may have a thickness of about 50 nm, the Al layer may have a thickness of about 200 nm, and the upper Ti layer may have a thickness of about 100 nm.

Subsequently, as shown in portions (a) and (d) of FIG. 5, a protective layer 8b is formed by sputtering and photolithographic processes so as to cover the channel region of the first and second oxide semiconductor films 5a' and 5b'. When the protective layer 8b is formed, a hole 8bu which overlaps with the gate connecting layer 3a when viewed along a normal to the substrate 2 is created to expose the gate connecting layer 3a partially. In addition, inside the hole 8bu, the second oxide semiconductor film 5b' is also exposed partially (as indicated by the dotted circle in portion (d) of FIG. 5). The protective layer 8b may be made of an insulating oxide (such as $SiO_2$), for example, and may have a thickness of about 150 nm. Also, when viewed along a normal to the substrate 2, an end portion of the protective layer 8b is suitably located on the drain electrode 6d. The reason is that the transparent electrode 7 can be extended to the vicinity of the end portion of the drain electrode 6d in that case.

Thereafter, a portion of the first oxide semiconductor film 5a' is subjected to a resistance lowering process. The rest of the first oxide semiconductor film 5a' which is covered with the source and drain electrodes 6s, 6d and the protective layer 8b is not subjected to the resistance lowering process. As a result, as shown in portion (a) of FIG. 5, that portion of the first oxide semiconductor film 5a' that has been subjected to the resistance lowering process turns into a transparent electrode 7, while the other portion that has not been subjected to the resistance lowering process turns into an oxide semiconductor layer 5. In addition, a portion of the second oxide semiconductor film 5b' which is exposed inside the hole 8bu is also subjected to the resistance lowering process and has its resistance lowered. Naturally, the electrical resistance of that portion subjected to the resistance lowering process is lower than that of the other portion not subjected to the resistance lowering process. The resistance lowering process may be plasma processing or doping a p-type or n-type impurity, for example. If a p-type or n-type impurity doping process is adopted as the resistance lowering process, then the impurity concentration of the transparent electrode 7 is higher than that of the oxide semiconductor layer 5. Also, due to diffusion of the impurity, a portion of the oxide semiconductor film 5' which is located under the drain electrode 6d may sometimes have its resistance lowered and form part of the transparent electrode 7. As will be described later, when a doping system is used to implant an impurity, the resistance lowering process can be carried out with the impurity implanted through an insulating layer, and therefore, it is possible to cope with various manufacturing processes flexibly.

Examples of alternative resistance lowering processes include hydrogen plasma processing using a CVD system, argon plasma processing using an etching system, and an annealing process under a reducing ambient.

Next, as shown in portions (b) and (e) of FIG. 5, an interlayer insulating layer 8a is formed by CVD process over the transparent electrode 7 and the protective layer 8b. The interlayer insulating layer 8a may be made of $SiN_x$, for example, and may have a thickness of about 200 nm. While the interlayer insulating layer 8a is formed, a contact hole CH which overlaps with the gate connecting layer 3a is created by a known method so as to overlap with the gate connecting layer 3a. Inside the contact hole CH, the gate connecting layer 3a and source connecting layer 6a are exposed at least partially.

Subsequently, as shown in portions (c) and (f) FIG. 5, a transparent electrode 9 and a transparent connecting layer 9a are formed on the interlayer insulating layer 8a out of the same transparent conductive film by sputtering process, for example. At least a portion of the transparent electrode 9 overlaps with the transparent electrode 7 with the interlayer insulating layer 8a interposed between them. The transparent connecting layer 9a electrically connects the gate connecting layer 3a and source connecting layer 6a together inside the contact hole CH. The transparent electrode 9 and transparent connecting layer 9a may be made of ITO, for example, and may have a thickness of about 100 nm.

As described above, sometimes the protective layer 8b may be omitted.

Figure 6:
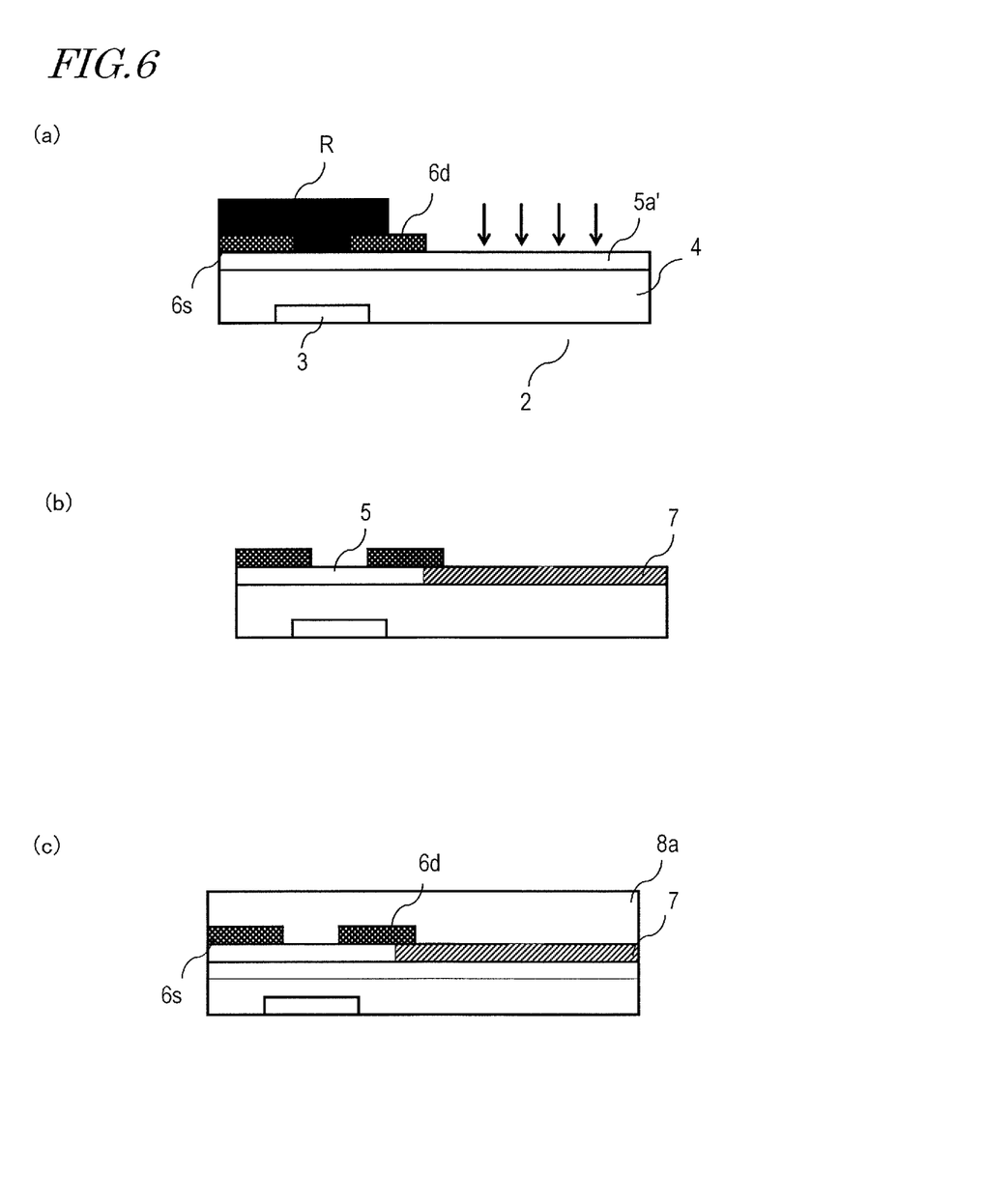
Figure 7:
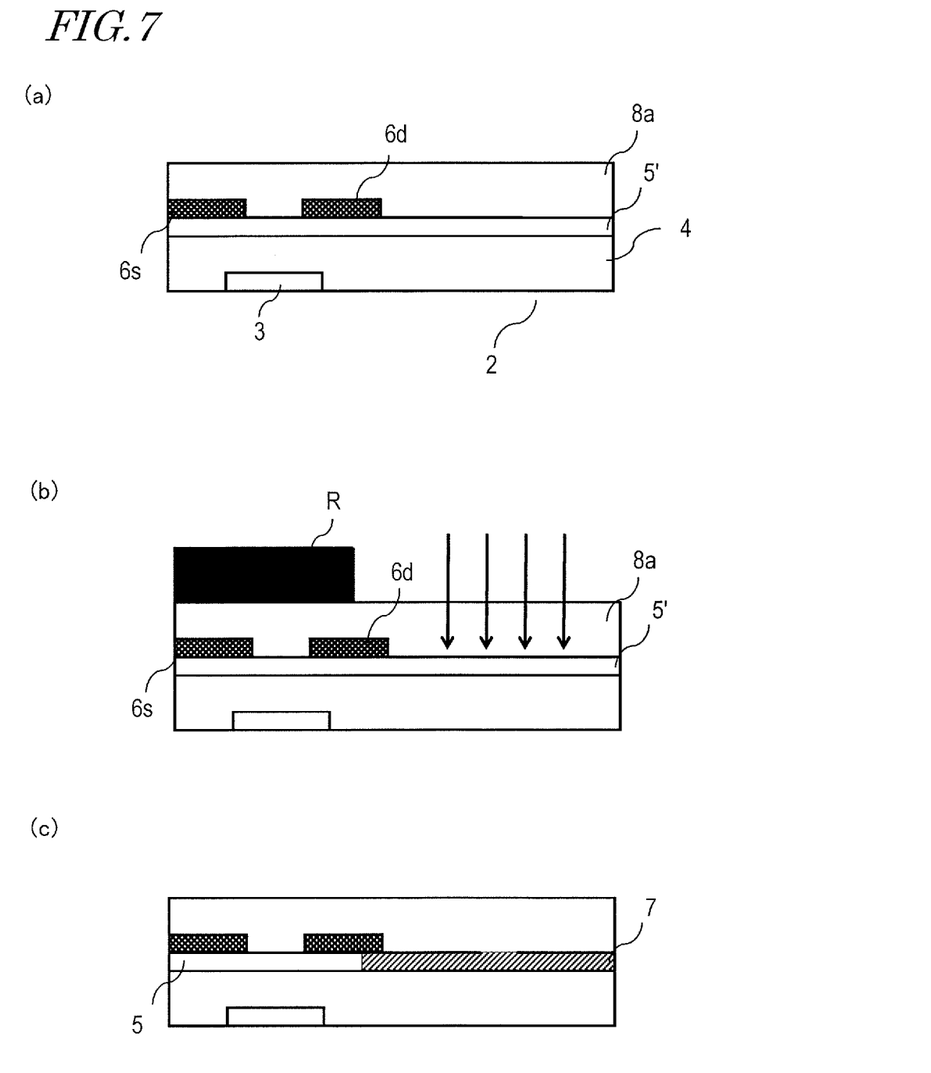
Figure 8:
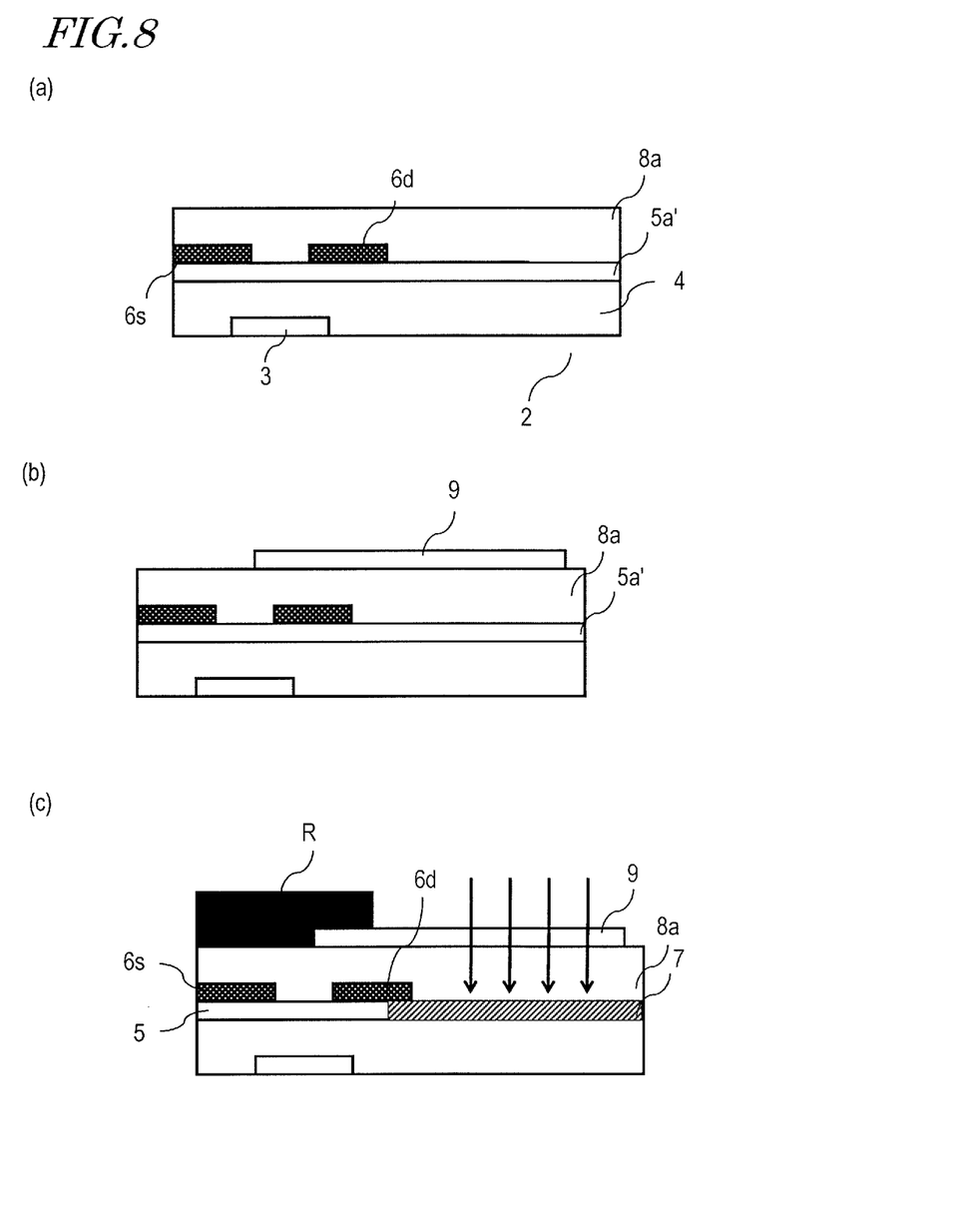

Next, it will be described with reference to FIGS. 6 through 8 how to fabricate a modified example of the TFT substrate 100A including no protective layer 8b. The following description will be focused on how to make a TFT 10A in the display area 110. As to how to make a driver circuit TFT in the driver circuit area 120 and how to make a connecting portion to connect the gate connecting layer 3a and source connecting layer 6a, it will be described only when needed to avoid redundancies.

First of all, an exemplary method for fabricating a modified example of the TFT substrate 100A will be described with reference to FIG. 6.

FIGS. 6(a) to 6(c) are schematic cross-sectional views illustrating respective manufacturing process steps to fabricate a modified example of the TFT substrate 100A.

First, a gate electrode 3, a gate connecting layer 3a, a gate insulating layer 4, first and second oxide semiconductor films 5a' and 5b', a source electrode 6s, a drain electrode 6d, source/drain electrodes 6x, a source connecting layer 6a and other members are formed as described above on a substrate 2 (see portions (a) through (h) of FIG. 4).

Next, as shown in FIG. 6(a), a protective layer R (which will be sometimes hereinafter referred to as a "resist mask layer") is formed by a known method so as to contact with the channel region of the first and second oxide semiconductor films 5a' and 5b'. The resist mask layer R may be made of a photosensitive resin, for example. Also, when viewed along a normal to the substrate 2, an end portion of the resist mask layer R suitably overlaps with the drain electrode 6d, because the transparent electrode 7 can be extended to the vicinity of the end portion of the drain electrode 6d in that case.

Thereafter, a portion of the first oxide semiconductor film 5a' is subjected to the resistance lowering process by the method described above, while the other portion of the first oxide semiconductor film 5a' that is covered with the source and drain electrodes 6s, 6d and the resist mask layer R is not subjected to the resistance lowering process. As a result of the resistance lowering process, a transparent electrode 7 and an oxide semiconductor layer 5 are formed as described above (see FIG. 6(b)). After that, the resist mask layer R is removed by a known method. It should be noted that in some cases, a portion of the second oxide semiconductor film 5b' may also have its resistance lowered by going through the resistance lowering process (see portion (d) of FIG. 5).

Subsequently, as shown in FIG. 6(c), an interlayer insulating layer 8a is formed over the source and drain electrodes 6s, 6d and the transparent electrode 7 by the method described above. Although not shown, the interlayer insulating layer 8a is also formed over the source/drain electrodes 6x and source connecting layer 6a.

And then a transparent electrode 9 is formed on the interlayer insulating layer 8a by the method described above, and a transparent connecting layer 9a is formed to electrically connect the gate connecting layer 3a and source connecting layer 6a together.

Next, another exemplary method for fabricating a modified example of the TFT substrate 100A will be described with reference to FIG. 7. Specifically, FIGS. 7(a) to 7(c) are schematic cross-sectional views illustrating respective manufacturing process steps to fabricate the modified example of the TFT substrate 100A.

First, a gate electrode 3, a gate connecting layer 3a, a gate insulating layer 4, first and second oxide semiconductor films 5a' and 5b', a source electrode 6s, a drain electrode 6d, source/drain electrodes 6x, a source connecting layer 6a and other members are formed as described above on a substrate 2 (see portions (a) through (c) of FIG. 4).

Next, as shown in FIG. 7(a), an interlayer insulating layer 8a is formed over the source electrode 6s, drain electrode 6d, source/drain electrodes 6x, source connecting layer 6a, and the first oxide conductive film 5a'.

Subsequently, as shown in FIG. 7(b), a resist mask layer R to protect the channel region of the first and second oxide conductive films 5a' and 5b' is formed by a known method. The resist mask layer R is formed on the interlayer insulating layer 8a. When viewed along a normal to the substrate 2, an end portion of the resist mask layer R suitably overlaps with the drain electrode 6d, because the transparent electrode 7 can be extended to the vicinity of the end portion of the drain electrode 6d in that case.

Thereafter, a portion of the first oxide semiconductor film 5a', 5b' is subjected to the resistance lowering process by the method described above, while the other portion of the first oxide semiconductor film 5a' that is covered with the source and drain electrodes 6s, 6d and the resist mask layer R is not subjected to the resistance lowering process. As a result of the resistance lowering process, a transparent electrode 7 and an oxide semiconductor layer 5 are formed as described above (see FIG. 7(c)). After that, the resist mask layer R is removed by a known method.

And then a transparent electrode 9 is formed on the interlayer insulating layer 8a by the method described above, and a transparent connecting layer 9a is formed to electrically connect the gate connecting layer 3a and source connecting layer 6a together.

Next, another modified example of the TFT substrate 100A will be described with reference to FIG. 8. Specifically, FIGS. 8(a) to 8(c) are schematic cross-sectional views illustrating respective manufacturing process steps to fabricate the modified example of the TFT substrate 100A.

First, a gate electrode 3, a gate connecting layer 3a, a gate insulating layer 4, first and second oxide semiconductor films 5a' and 5b', a source electrode 6s, a drain electrode 6d, source/drain electrodes 6x, a source connecting layer 6a and other members are formed as described above on a substrate 2 (see portions (a) through (c) of FIG. 4).

Next, as shown in FIG. 8(a), an interlayer insulating layer 8a is formed over the source electrode 6s, drain electrode 6d, source/drain electrodes 6x, source connecting layer 6a, and the first oxide conductive film 5a'.

Subsequently, as shown in FIG. 8(b), a transparent electrode 9 is formed on the interlayer insulating layer 8a by the method described above.

Next, as shown in FIG. 8(c), a resist mask layer R to protect the channel region of the first and second oxide semiconductor films 5a' and 5b' is formed by a known method. The resist mask layer R is formed on the interlayer insulating layer 8a.

Thereafter, respective portions of the first and second oxide semiconductor films 5a' and 5b' are subjected to the resistance lowering process by the method described above, while the other portion of the first oxide semiconductor film 5a' that is covered with the source and drain electrodes 6s, 6d and the resist mask layer R is not subjected to the resistance lowering process. As a result of the resistance lowering process, a transparent electrode 7 and an oxide semiconductor layer 5 are formed as described above. After that, the resist mask layer R is removed by a known method.

Among the methods for fabricating the modified example of the TFT substrate 100A described above, if the modified example of the TFT substrate 100A is fabricated by performing the resistance lowering process with a p-type or n-type impurity doped through the interlayer insulating layer 8a at least, a portion of the interlayer insulating layer 8a which is located over the transparent electrode 7 is doped with the p-type or n-type impurity more heavily than the other portion thereof.

As can be seen from the foregoing description, embodiments of the present invention provide a TFT substrate as a semiconductor device which can be fabricated by a simple process and in which an area not contributing to a display operation has been narrowed and a method for fabricating such a semiconductor device.

INDUSTRIAL APPLICABILITY

Embodiments of the present invention are applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 2 substrate
3 gate electrode
4 gate insulating layer
4a lower gate insulating layer
4b upper gate insulating layer
5 oxide semiconductor layer
6s source electrode
6d drain electrode
7 first transparent electrode
8 interlayer insulating layer
8a protective layer
8 dielectric layer
9 transparent electrode
100A semiconductor device (TFT substrate)

The invention claimed is:
1. A semiconductor device comprising a substrate and a thin-film transistor formed on the substrate, wherein the thin-film transistor includes:
a gate electrode formed on the substrate;
a gate insulating layer formed over the gate electrode;
an oxide semiconductor layer formed on the gate insulating layer; and
a source and drain electrodes electrically connected to the oxide semiconductor layer,
the semiconductor device further includes:
a gate connecting layer formed out of a same conductive film as the gate electrode;
a source connecting layer formed out of a same conductive film as the source electrode;
a first transparent electrode that contains an impurity at a higher concentration than the oxide semiconductor layer and is electrically connected to the drain electrode;
an interlayer insulating layer formed over the source and drain electrodes, a first portion of the interlayer insulating layer that is located on the first transparent electrode contains an impurity at a higher concentration than a second portion thereof;
a second transparent electrode formed on the interlayer insulating layer; and
a transparent connecting layer formed out of a same conductive film as the second transparent electrode,
wherein the source connecting layer is electrically connected to the gate connecting layer via the transparent connecting layer, and
the oxide semiconductor layer and the first transparent electrode are formed out of a same oxide film.

2. The semiconductor device of claim 1, wherein the gate insulating layer is formed on the gate connecting layer, the source connecting layer contacts with an upper surface of an oxide layer formed out of the oxide film, the gate insulating layer and the interlayer insulating layer have a contact hole which overlaps with the gate connecting layer when viewed along a normal to the substrate, portions of the source connecting layer and the oxide layer contact with each other inside the contact hole, and an electrical resistance of a portion of the oxide layer which contacts with the transparent connecting layer inside the contact hole is lower than an electrical resistance of the oxide semiconductor layer.

3. The semiconductor device of claim 1, wherein an end portion of the source connecting layer is arranged over the gate connecting layer.

4. The semiconductor device of claim 1, wherein the second transparent electrode overlaps with the first transparent electrode with the interlayer insulating layer interposed between them.

5. The semiconductor device of claim 1, wherein the oxide film includes In, Ga and Zn.

* * * * *